United States Patent
Hong et al.

(10) Patent No.: US 8,487,333 B2
(45) Date of Patent: Jul. 16, 2013

(54) LED PACKAGE AND METHOD FOR MANUFACTURING THE SAME

(75) Inventors: Meng-Hsien Hong, Hsinchu (TW); Ko-Wei Chien, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 169 days.

(21) Appl. No.: 13/172,848

(22) Filed: Jun. 30, 2011

(65) Prior Publication Data

US 2012/0119244 A1 May 17, 2012

(30) Foreign Application Priority Data

Nov. 17, 2010 (CN) .......................... 2010 1 0543948

(51) Int. Cl.
*H01L 33/00* (2010.01)
*H01L 21/56* (2006.01)

(52) U.S. Cl.
USPC 257/98; 257/100; 257/E33.067; 257/E33.071; 257/E21.502; 438/27; 977/742

(58) Field of Classification Search
USPC ................... 257/98, 100, E33.067, E33.071, 257/E21.502; 438/27
See application file for complete search history.

(56) References Cited

U.S. PATENT DOCUMENTS

| | | | |
|---|---|---|---|
| 2011/0297846 A1* | 12/2011 | Wang | 250/459.1 |
| 2012/0065343 A1* | 3/2012 | Bahadur et al. | 525/478 |
| 2012/0170277 A1* | 7/2012 | Tamura et al. | 362/296.02 |
| 2013/0048957 A1* | 2/2013 | Ono | 257/40 |

* cited by examiner

*Primary Examiner* — Victor A Mandala
(74) *Attorney, Agent, or Firm* — Altis Law Group, Inc.

(57) ABSTRACT

An LED package includes a substrate, an LED chip, and an encapsulation. The substrate includes a first surface. The LED chip is mounted on the first surface of the substrate. The encapsulation covers the LED chip. The encapsulation includes a transparent main body and a number of carbon nanotubes distributed in the transparent main body; the carbon nanotubes are arranged substantially extending along a same direction whereby light generated by the LED chip is polarized prior to radiation out of the encapsulation.

19 Claims, 2 Drawing Sheets

LED PACKAGE AND METHOD FOR MANUFACTURING THE SAME

BACKGROUND

1. Technical Field

The present disclosure relates to semiconductor packages and, particularly, to an LED (light emitting diode) package and a method for manufacturing the LED package.

2. Description of Related Art

Light emitting diodes (LEDs) have many beneficial characteristics, including low electrical power consumption, low heat generation, long lifetime, small volume, good impact resistance, fast response and excellent stability. These characteristics have made the LEDs widely used in illuminating lamps or light sources of liquid crystal displays etc. The light emitting from a conventional LED is omnidirectional, not polarized to a specific direction; however, in some occasions, a polarized light may be required; when such polarized light is required, the conventional art is to have an extra polarizing filter to obtain the polarized light. The extra polarizing filter increases the cost and volume of the conventional LED package.

What is needed is an LED package and a method for manufacturing the LED package which can ameliorate the problem of the prior art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the present disclosure will now be described in detail below, with reference to the accompanying drawing.

Figure 1:
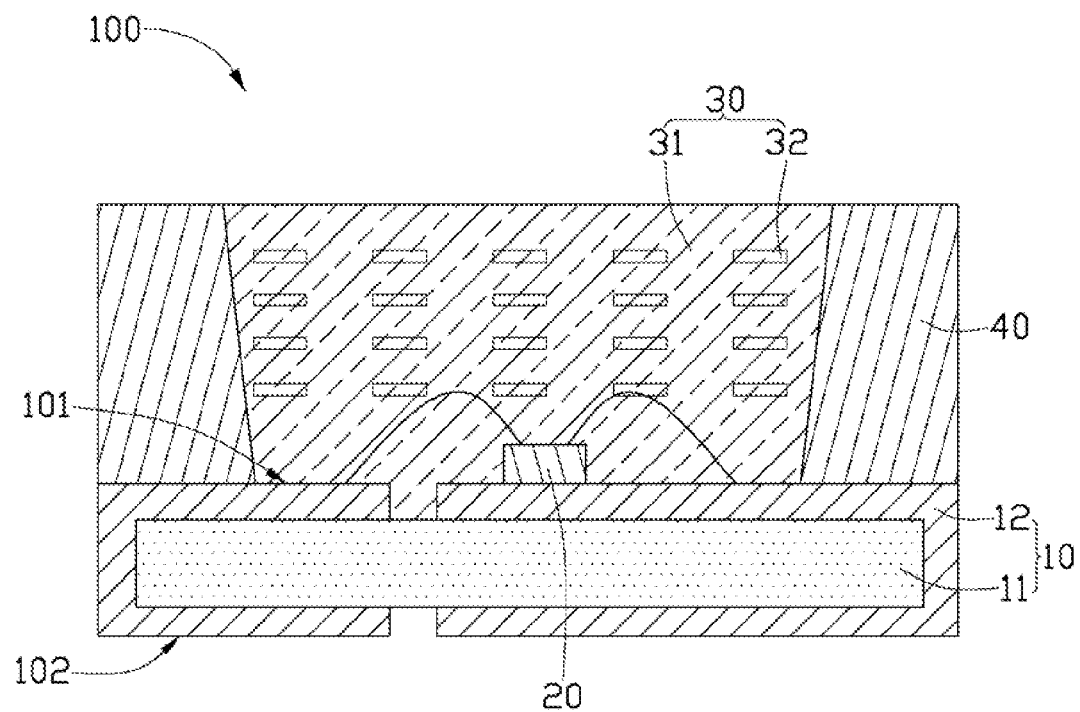
FIG. 1 is a schematic, cross-sectional view of an LED package according to an exemplary embodiment.

Referring to FIG. 1, an LED package 100 according to an exemplary embodiment is shown. The LED package 100 includes a substrate 10, an LED chip 20, an encapsulation 30, and a reflective cup 40.

The substrate 10 includes an insulator 11 and two electrodes 12. The substrate 10 includes a first surface 101 and a second surface 102 opposite to the first surface 101. Each of the two electrodes 12 extends from the first surface 101 to the second surface 102, so that the LED package 100 can be conveniently mounted on a circuit board (not shown) using surface mounting technology. The insulator 11 is made of thermally conductive and electrically insulating material such as epoxy, silicone, silicon oxide or a mixture thereof. The electrodes 12 can be made of metal or alloy such as indium tin oxide (ITO), copper (Cu), nickel (Ni), silver (Ag), aluminum (Al), tin (Sn), gold (Au) or an alloy thereof.

The LED chip 20 is mounted on the first surface 101 of the substrate 10, and is electrically connected to the two electrodes 12. In the present embodiment, the LED chip 20 is mounted on an end of one electrode 12 defining a portion of the first surface 101. The LED chip 20 is electrically connected to the electrodes 12 via two wires (not labeled).

The encapsulation 30 covers the LED chip 20 for protecting the LED chip 20 from dust, water etc. The encapsulation 30 includes a transparent main body 31 and a number of carbon nanotubes 32 distributed in the transparent main body 31. The carbon nanotubes 32 are arranged substantially extending along a same direction, and are substantially parallel to each other. The transparent main body 31 can be made of a material selected from a group consisting of epoxy, silicone, silicon oxide, and a mixture thereof. The light emitting from the LED chip 20 can transmit through the transparent main body 31. Because the carbon nanotubes 32 arranged extending along a same direction can be used as a polarizing filter for polarizing the light transmitting through them, the light emitted from the LED chip 20 will became polarized light after transmitting through the encapsulation 30. That is the light emitted from the LED package 100 is a polarized light. Furthermore, the good thermal conductivity of the carbon nanotubes 32 can improve the heat dissipating efficiency of the LED package 100. In additional, the mechanical property of the carbon nanotubes 32 can also strengthen the encapsulation 30. Preferably, the encapsulation 30 further includes fluorescent powder, such as YAG, TAG, silicate, nitride, nitrogen oxides, phosphide or sulfide. The fluorescent powder is used for changing color of light from the LED chip 20 into a different color.

The reflective cup 40 is disposed on the first surface 101 of the substrate 10 and surrounds the LED chip 20 and the encapsulation 30. The reflective cup 40 is configured for reflecting the light irradiating thereon to improve the amount of the light emitted out of the LED package 100. The reflective cup 40 can be made of a light reflective material completely, or only has an inner surface thereof coated with a light reflective material. Preferably, the reflective cup 40 is made of thermally conductive and electrically insulating material. In the present embodiment, the carbon nanotubes 32 are arranged along a direction parallel to the first surface 101; because the carbon nanotubes 32 have an excellent axial thermal conductivity, the heat in the encapsulation 30 can be conducted to the reflective cup 40 quickly through the carbon nanotubes 32; accordingly, the heat dissipating efficiency of the LED chip 20 can be improved.

Figure 2:
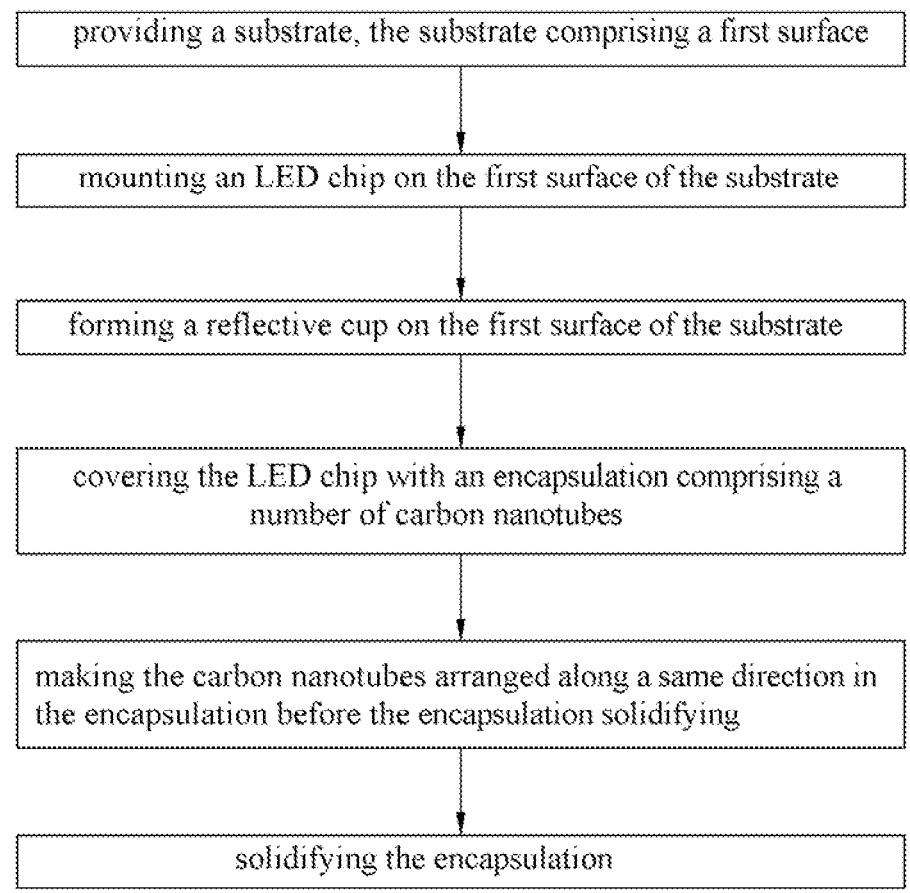
FIG. 2 is a flow chart of a method for manufacturing the LED package of FIG. 1.

Referring to FIG. 2, a method for manufacturing the LED package 100 according to an exemplary embodiment is shown. The method includes following steps:

The first step is to provide the substrate 10. The substrate 10 includes an insulator 11 and two electrodes 12. The substrate 10 includes a first surface 101 and a second surface 102 opposite to the first surface 101.

The second step is to mount the LED chip 20 on the first surface 101 of the substrate 10, and electrically connect the LED chip 20 to the electrodes 12. In the present embodiment, the LED chip 20 is electrically connected to the electrodes 12 via two wires (not labeled).

The third step is to form a reflective cup 40 on the first surface 101 of the substrate 10; the reflective cup 40 surrounds the LED chip 20. In an alternative embodiment, the LED package 100 can have no reflective cup; in that case, the third step can be omitted.

The fourth step is to cover the LED chip 20 with the encapsulation 30 including a number of carbon nanotubes 32 therein. Preferably, the carbon nanotubes 32 are mixed uniformly in the encapsulation 30.

The fifth step is to make the carbon nanotubes 32 oriented along a same direction in the encapsulation 30 by applying a magnetic field with a predetermined direction to the carbon nanotubes 32 in the encapsulation 30 before the encapsulation 30 is solidified. The intensity of the magnetic field can be larger than 10 teslas.

The sixth step is to solidify the encapsulation 30, and obtain the LED package 100.

While certain embodiments have been described and exemplified above, various other embodiments will be apparent to those skilled in the art from the foregoing disclosure. The disclosure is not limited to the particular embodiments described and exemplified, and the embodiments are capable of considerable variation and modification without departure from the scope and spirit of the appended claims.

What is claimed is:

1. An LED package comprising:
    a substrate comprising a first surface;
    an LED chip mounted on the first surface of the substrate; and
    an encapsulation covering the LED chip, the encapsulation comprising a transparent main body and a plurality of carbon nanotubes distributed in the transparent main body, the carbon nanotubes being arranged substantially extending along a same direction, whereby light generated by the LED chip is polarized by the carbon nanotubes before transmitting to an outside of the LED package.

2. The LED package as claimed in claim 1, wherein the substrate comprises an insulator and two electrodes, the substrate further comprises a second surface opposite to the first surface, each of the two electrodes extends from the first surface to the second surface.

3. The LED package as claimed in claim 2, wherein the insulator is made of thermally conductive and electrically insulating material.

4. The LED package as claimed in claim 2, wherein the electrodes are made of metal or alloy.

5. The LED package as claimed in claim 2, wherein the LED chip is mounted on an end of one of the electrodes defining a portion of the first surface.

6. The LED package as claimed in claim 1, wherein the transparent main body is made of a material selected from a group consisting of epoxy, silicone, silicon oxide, and a mixture thereof.

7. The LED package as claimed in claim 1, wherein the encapsulation further comprises fluorescent powder.

8. The LED package as claimed in claim 1 further comprising a reflective cup disposed on the first surface of the substrate and surrounding the LED chip and the encapsulation.

9. The LED package as claimed in claim 8, wherein the reflective cup is made of thermally conductive and electrically insulating material.

10. The LED package as claimed in claim 9, wherein the carbon nanotubes are arranged along a direction parallel to the first surface.

11. A method for manufacturing an LED package comprising:
    providing a substrate, the substrate comprising a first surface;
    mounting an LED chip on the first surface of the substrate;
    covering the LED chip with an encapsulation comprising a plurality of carbon nanotubes therein;
    making the carbon nanotubes oriented along a same direction in the encapsulation before the encapsulation is solidified; and
    solidifying the encapsulation.

12. The method as claimed in claim 11, wherein the carbon nanotubes are arranged along a same direction by applying a magnetic field with a predetermined direction to the carbon nanotubes in the encapsulation.

13. The method as claimed in claim 12, wherein an intensity of the magnetic field is larger than 10 teslas.

14. The method as claimed in claim 11 further comprising a step of forming a reflective cup on the first surface of the substrate, wherein the reflective cup surrounds the LED chip.

15. The method as claimed in claim 14, wherein the reflective cup is made of thermally conductive and electrically insulating material.

16. The method as claimed in claim 15, wherein the carbon nanotubes are oriented along a direction parallel to the first surface.

17. The method as claimed in claim 11, wherein the substrate comprises an insulator and two electrodes, the substrate further comprises a second surface opposite to the first surface, each of the two electrodes extends from the first surface to the second surface.

18. The method as claimed in claim 17, wherein the LED chip is mounted on an end of one of the electrodes defining a portion of the first surface.

19. The method as claimed in claim 11, wherein the encapsulation further comprises fluorescent powder.

* * * * *